US006617283B2

United States Patent
Paranthaman et al.

(10) Patent No.: US 6,617,283 B2
(45) Date of Patent: Sep. 9, 2003

(54) METHOD OF DEPOSITING AN ELECTRICALLY CONDUCTIVE OXIDE BUFFER LAYER ON A TEXTURED SUBSTRATE AND ARTICLES FORMED THEREFROM

(75) Inventors: M. Parans Paranthaman, Knoxville, TN (US); Tolga Aytug, Oak Ridge, TN (US); David K. Christen, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 09/888,115

(22) Filed: Jun. 22, 2001

(65) Prior Publication Data

US 2002/0198112 A1 Dec. 26, 2002

(51) Int. Cl.$^7$ ............ H01B 12/00; H01F 6/00; H01L 39/00
(52) U.S. Cl. ............ 505/238; 505/237; 428/699; 428/702; 428/930; 174/125.1
(58) Field of Search ............ 428/697, 699, 428/701, 702, 930; 505/230, 237, 238, 239; 174/125.1

(56) References Cited

U.S. PATENT DOCUMENTS

| | | | |
|---|---|---|---|
| 5,270,298 A | * 12/1993 | Ramesh | 505/238 |
| 5,418,081 A | 5/1995 | Kawasaki et al. | |
| 5,470,668 A | * 11/1995 | Wu et al. | 428/688 |
| 5,739,086 A | * 4/1998 | Goyal et al. | 505/473 |
| 5,856,276 A | * 1/1999 | Koshy et al. | 505/239 |
| 5,872,080 A | * 2/1999 | Arendt et al. | 505/238 |
| 6,027,826 A | * 2/2000 | deRochemont et al. | 428/702 |
| 6,077,344 A | * 6/2000 | Shoup et al. | 117/9 |
| 6,117,571 A | 9/2000 | Baum et al. | |
| 6,296,701 B1 | * 10/2001 | Christen et al. | 117/94 |
| 6,351,006 B1 | * 2/2002 | Yamakawa et al. | 257/310 |
| 6,428,635 B1 | * 8/2002 | Fritzemeier et al. | 148/435 |
| 6,455,166 B1 | 9/2002 | Truchan et al. | |
| 6,458,223 B1 | * 10/2002 | Hans Thieme et al. | 148/435 |

OTHER PUBLICATIONS

M. Paranthaman, et al., "Growth of biaxially textured buffer layers on rolled–Ni substrates by electron beam evaporation", Physica C 275 (1997) pp. 266–272.

Frank McNally, et al., "Fatigue properties of lanthanum strontium manganate–lead zirconate titanate epitaxial thin film geterostrutures prodiced by a chemical solution deposition method" J. Mater Res., vol. 15, No. 7, Jul. 2000, pp. 1546–1550.

* cited by examiner

Primary Examiner—Tom Dunn
Assistant Examiner—Colleen P. Cooke
(74) Attorney, Agent, or Firm—Akerman Senterfitt

(57) ABSTRACT

An article with an improved buffer layer architecture includes a substrate having a textured metal surface, and an electrically conductive lanthanum metal oxide epitaxial buffer layer on the surface of the substrate. The article can also include an epitaxial superconducting layer deposited on the epitaxial buffer layer. An epitaxial capping layer can be placed between the epitaxial buffer layer and the superconducting layer. A method for preparing an epitaxial article includes providing a substrate with a metal surface and depositing on the metal surface a lanthanum metal oxide epitaxial buffer layer. The method can further include depositing a superconducting layer on the epitaxial buffer layer, and depositing an epitaxial capping layer between the epitaxial buffer layer and the superconducting layer.

20 Claims, 16 Drawing Sheets

| YBCO |
|---|
| CeO$_2$ |
| YSZ |
| LSMO |
| Ni or Ni alloy |

| YBCO |
|---|
| CeO$_2$ |
| LSMO |
| Ni or Ni alloy |

| YBCO |
|---|
| LNO |
| LSMO |
| Ni or Ni alloy |

| YBCO |
|---|
| SRO |
| LSMO |
| Ni or Ni alloy |

| YBCO |
|---|
| LSMO |
| Ni or Ni alloy |

FIG. 2

Pole figure of La$_{0.7}$Sr$_{0.3}$MnO$_3$ on Ni

SEM surface morphology of $La_{0.7}Sr_{0.3}MnO_3$ on Ni

YBCO/LSMO/Ni
YBCO (113) Pole Figure

Pole figure of LMO on Ni

METHOD OF DEPOSITING AN ELECTRICALLY CONDUCTIVE OXIDE BUFFER LAYER ON A TEXTURED SUBSTRATE AND ARTICLES FORMED THEREFROM

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

CROSS-REFERENCE TO RELATED APPLICATIONS (Not Applicable)

FIELD OF THE INVENTION

The invention relates generally to epitaxial metal oxide buffer layers on metal substrates and articles made therefrom. More specifically, the invention relates to a process for depositing electrically conductive oxide epitaxial layers on textured metal substrates, and articles made therefrom.

BACKGROUND OF THE INVENTION

Epitaxial metal oxide buffer layers on substrates with crystalline, polycrystalline, or biaxially-textured metal surfaces are potentially useful where an electronically active layer is deposited on the buffer layer. The term "epitaxial" is used herein and understood by those skilled in the art to mean the growth (method) and placement (apparatus) of a crystalline substance on a crystalline substrate, where the crystalline substance formed follows the crystallographic orientation of the crystalline substrate. Epitaxial crystal growth advantageously permits the formation of crystallographic layers having a high level of crystallographic correlation with respect to an underlying crystalline substrate layer, permitting the formation of improved devices.

The electronically active layer may be a superconductor, a semiconductor, a ferro-electric or an opto-electric material. For example, a biaxially-textured superconductor article to be used for power transmission lines has a multi-layer composition 10, as in FIG. 1. Such deposited superconductor articles most commonly consist of a biaxially-textured metal surface 12, a plurality of buffer layers 14, 16, and a superconducting layer 18. The biaxially-textured metal surface 12, most commonly formed from Cu, Ag, Ni, or Ni alloys, provides support for the superconductor article, and can be fabricated over long lengths and large areas. Epitaxial metal oxide buffer layers 14, 16 comprise the next layers in the superconductor article. The buffer layers 14, 16 are commonly formed from $Y_2O_3$ or $CeO_2$, and serve as chemical barriers between the metal surface 12 and the last layer, the last layer being superconducting layer 18.

Current materials research aimed at fabricating improved high-temperature superconductor articles is largely focused on epitaxial growth of high-temperature superconducting layers on biaxially-textured metal surfaces. A biaxially-textured article can be defined as a polycrystalline material in which the crystallographic in-plane and out-of-plane grain-to-grain misorientatioris are small (typically less than 20 degrees) but finite (typically greater than 2 degrees). Superconducting articles with current densities ($J_c$) in excess of 0.1 $MA/cm^2$ at 77 K have been achieved for epitaxial $YBa_2Cu_3O_7$ films on biaxially-textured Ni or Ni-based alloy surfaces with the use of certain epitaxial buffer layer constructs between the metal surface and the superconducting layer. In previous work, the synthesis of high-temperature superconductor layers capable of carrying a high (at least 0.1 $MA/cm^2$ at 77 K) $J_c$ has required the use of complex, multilayered buffer architectures.

In order to realize a high-temperature superconducting layer, such as $YBa_2Cu_3O_7$, possessing a $J_c$ greater than approximately 0.1 $MA/cm^2$ at 77 K on a biaxially-textured metal substrate, the buffer layer architecture should be epitaxial relative to the metal substrate and crack-free. Most preferably, the grains of the buffer layer should be crystallographically aligned perpendicular to the plane of the metal substrate (c-axis oriented) and parallel to the plane of the metal substrate (a-b alignment).

Formation of superconductor articles with this orientation begins with the selection of the metal surface 12. The crystallographic orientation of the metal surface 12 is preferably maintained in the buffer layers 14, 16 and the superconducting layer 18, to the maximum extent possible. Numerous conventional processes are currently being used to grow buffer layers 14, 16 on a metal substrate 12. These processes include vacuum methods, such as pulsed laser deposition, physical vapor deposition electron beam evaporation and sputtering. Also, non-vacuum deposition processes, such as chemical solution deposition and chemical vapor deposition can be used for this purpose.

In addition to being epitaxial relative to the biaxially-textured metal surface, buffer layers 14, 16 are preferably chemically compatible with both the metal surface and superconductor, and mechanically robust so as to prevent microscopic crack formation in the high-temperature superconducting layer and the buffer layers. Prior to the present invention, buffer layers that met these objectives have required multilayer combinations of various oxides.

For example, $CeO_2$ has been used to nucleate an epitaxial (001) oriented oxide layer on a biaxially textured (100) Ni surface However, $CeO_2$ films of over 100 nm thickness form cracks on {100}<001> textured Ni substrates due to significant differences in the thermal expansion coefficients of the oxide film and the Ni substrate. Cracking has prevented utilization of $CeO_2$ as a single buffer layer.

Also, YBCO films grown directly on a YSZ buffer layer on Ni substrates result in two in-plane orientations. This is due to the lattice mismatch between YBCO and YSZ layers. This generally prevents use of YSZ as a single buffer layer.

An additional buffer layer, such as an epitaxial yttria-stabilized zirconia (YSZ) buffer layer on a $CeO_2$ buffer layer has been used to achieve substantially crack-free superconductor articles. The architecture of $YBCO/CeO_2/YSZ/CeO_2/$Ni has been the standard architecture for the rolling-assisted biaxially textured substrate (RABiTS) based YBCO coated conductors. In this arrangement, the superior mechanical properties of the YSZ layer substantially circumvent the microcracking problem, and enable the formation of superconducting layers with a high $J_c$. The $CeO_2$ layer serves primarily to nucleate a (001) oriented epitaxial oxide on the metal surface.

An alternative multi-layer buffer layer uses conducting SRO ($SrRuO_3$ or $Sr_2RuO_4$) and LNO ($LaNiO_3$)buffer layers to form YBCO/SRO/LNO/Ni. The suppression of superconducting critical temperatures ($T_c$) of 75–80 K for YBCO films grown directly on LNO buffers has prevented the use of LNO as the single buffer layer. Also, the preparation of both SRO and LNO target materials are extremely difficult.

Though effective in forming a high $J_c$ superconductor article, the use of a multilayer buffer architecture, as opposed to a single layer buffer architecture, increases the complexity of the superconductor article fabrication process. Using multiple buffer layers typically requires the use of additional raw materials, as compared to a single buffer layer architecture. In addition, having $CeO_2$ as the nucleating layer tends to permit the formation of microscopic cracks that can limit the maximum $J_c$ of the superconductor article or result in reliability problems during field use.

Epitaxial metal oxides on crystalline or polycrystalline metal surfaces have potential application in fields other than superconductors. Epitaxial metal oxides on crystalline metal surfaces may prove useful where thin epitaxial layers are needed in electronic applications. Furthermore, epitaxial oxide layers on polycrystalline metal surfaces have potential use in tribological or fuel cell applications where the properties of the metal/oxide interface largely determine material performance. For epitaxy on randomly-oriented polycrystalline metal surfaces, the epitaxial relationship involves a grain-by-grain registry of film and substrate crystallographic orientations.

SUMMARY

An epitaxial article includes a substrate having a textured metal surface, a single lanthanum metal oxide epitaxial buffer layer disposed on and in contact with a surface of the substrate, and an electromagnetically active layer disposed on and in contact with the single epitaxial buffer layer. The lanthanum metal oxide epitaxial buffer layer can be selected from compounds having the general formula $La_{1-x}A_xMO_3$, where A and M are metals and $0 \leq x \leq 0.8$. A can be Sr, Ba or Ca, while M can be Mn or Co. The buffer layer can have a resistivity of less than 1 mOhm-cm at 300 K, or more preferably less than 0.1 mOhm-cm.

The electromagnetically active layer preferably includes a superconducting layer, the superconductor layer being an oxide superconductor. The oxide superconductor layer can be $REBa_2Cu_3O_7$ where RE is a rare earth element, $Tl_1Ba_2Ca_{n-1}CunO_{2n+3}$, where n is an integer between 1 and 4, $Tl_2Ba_2Ca_{n-1}Cu_nO_{2n+4}$ where n is an integer between 1 and 4, or $Hg_1Ba_2Ca_{n-1}Cu_nO_{2n+2}$, where n is an integer between 1 and 4.

The textured substrate can be a rolled and annealed biaxially-textured metal substrate. The textured metal surface can be a metal selected from Cu, Cu-based alloys, Co, Mo, Cd, Pd, Pt, Ag, Al, Ni, and Ni-based alloys. Alternatively, the textured metal surface can be a metal selected from Ni or Ni-based alloys with at least one alloying agent selected from Co, Cr, V, Mo, W, and rare earth elements.

In an alternate embodiment of the invention, an epitaxial article includes a substrate having a textured metal surface, a lanthanum metal oxide epitaxial buffer layer disposed on and in contact with a surface of the substrate, and at least one epitaxial capping layer disposed on and in contact with the lanthanum metal oxide epitaxial buffer layer. The epitaxial capping layer is a different composition compared to the buffer layer. An electromagnetically active layer is disposed on and in contact with the epitaxial capping layer.

The epitaxial buffer layer can be selected from compounds having the general formula $La_{1-x}A_xMO_3$, where A and M are metals and $0 \leq x \leq 0.8$. A can be Sr, Ba or Ca and M can be Mn or Co.

The electromagnetically active layer can include a superconducting layer. Preferably, the superconductor layer is an oxide superconductor. The oxide superconductor can be $REBa_2Cu_3O_7$, where RE is a rare earth element, $Tl_1Ba_2Ca_{n-1}Cu_nO_{2n+3}$, where n is an integer between 1 and 4, $Tl_2Ba_2Ca_{n-1}Cu_nO_{2n+4}$, where n is an integer between 1 and 4, or $Hg_1Ba_2Ca_{n-1}Cu_nO_{2n+2}$, where n is an integer between 1 and 4.

The substrate can be a rolled and annealed biaxially-textured metal substrate. The metal textured surface can be a Cu, Cu-based alloy, Co, Mo, Cd, Pd, Pt, Ag, Al Ni, or a Ni-based alloy. The textured surface can be Ni or a Ni-based alloy with at least one alloying agent selected from Co, Cr, V, Mo, W, and rare earth elements. The epitaxial capping layer can be a rare earth oxide. The capping layer can be SRO, LNO, YSZ, $CeO_2$ or $Y_2O_3$.

A method for preparing an epitaxial article, includes the steps of providing a substrate with a textured metal surface, depositing a single lanthanum metal oxide epitaxial buffer layer on and in contact with the surface of the substrate, and depositing an electromagnetically active layer on the single lanthanum metal oxide epitaxial buffer layer. Preferably, the substrate provides a biaxially-textured metal surface. The method can include the step of rolling and annealing a metal material to form a biaxially-textured substrate surface. Preferably, the metal rolled and annealed is Cu, Cu-based alloy, Co, Mo, Cd, Pd, Pt, Ag, Al, Ni, or a Ni-based alloy. If a Ni-based alloy is used, an alloying agent such as Co, Cr. V, Mo, W, and rare earth elements is preferably added.

The lanthanum metal oxide epitaxial buffer layer can have the general formula $La_{1-x}A_xMO_3$, where A and M are metals and $0 \leq x \leq 0.8$. A can be Sr, Ba or Ca, while M can be Mn or Co. The lanthanum metal oxide epitaxial buffer layer can have a resistivity at 300 K of less than 1 mOhm-cm, or more preferably, less than 0.1 mOhm-cm.

The electromagnetically active layer can include a superconducting layer. The superconductor layer is preferably an oxide superconductor, the oxide superconductor layer being $REBa_2Cu_3O_7$, where RE is a rare earth element, $Tl_1Ba_2Ca_{n-1}Cu_nO_{2n+3}$, where n is an integer between 1 and 4, $Tl_2Ba_2Ca_{n-1}Cu_nO_{2n+4}$, where n is an integer between 1 and 4, or $Hg_1Ba_2Ca_{n-1}Cu_nO_{2n+2}$, where n is an integer between 1 and 4.

The lanthanum metal oxide epitaxial buffer layer is preferably deposited by a sputtering process. The sputtering process can be rf-magnetron sputtering. The electromagnetically active layer can be deposited by a process of pulsed laser ablation, physical vapor deposition such as electron beam evaporation and sputtering, solution deposition and chemical vapor deposition.

A method for preparing an epitaxial article includes the steps of providing a substrate with a textured metal surface, depositing a single lanthanum metal oxide epitaxial buffer layer on the surface of the substrate, and depositing at least one epitaxial capping layer on the single lanthanum metal oxide epitaxial buffer layer. The epitaxial capping layer is of a different composition than the single lanthanum metal oxide epitaxial buffer layer. An electromagnetically active layer is deposited on the epitaxial capping layer.

The method can include the step of providing a biaxially-textured metal surface, preferably by rolling and annealing a metal material to form the biaxially-textured substrate. A metal substrate is preferably a Cu, Cu-based alloy, Co, Mo, Cd, Pd, Pt, Ag, Al, Ni, or Ni-based alloy. If a Ni-based alloy is used, alloying agents are preferably Co, Cr, V, Mo, W, or rare earth elements.

The Lanthanum metal oxide epitaxial buffer layer can be a compound having the general formula $La_{1-x}A_xMO_3$, where A and M are metals and $0 \leq x \leq 0.8$. A can be Sr, Ba and Ca. M can be Mn or Co.

The electromagnetically active layer can include a superconducting layer, preferably an oxide superconductor. The oxide superconductor can be $REBa_2Cu_3O_7$, where RE is a rare earth element, $Tl_1Ba_2Ca_{n-1}Cu_nO_{2n+3}$, where n is an integer between 1 and 4, $Tl_2Ba_2Ca_{n-1}Cu_nO_{2n+4}$, where n is an integer between 1 and 4 or $Hg_1Ba_2Ca_{n-1}Cu_nO_{2n+2}$, where n is an integer between 1 and 4.

The lanthanum metal oxide epitaxial buffer layer can be deposited by a sputtering process. The sputtering process is preferably an rf-magnetron sputtering process. The electromagnetically active layer is preferably deposited by a pulsed laser ablation process. The epitaxial capping layer can be SRO, LNO, YSZ, $CeO_2$, $Y_2O_3$ or a rare earth oxide.

An epitaxial article can provide a foundation for applying electromagnetically active layers directly thereon, and include a substrate having a textured metal surface, and a single lanthanum metal oxide epitaxial buffer layer disposed on and in contact with the surface of the substrate. No additional buffer layer is required with this architecture. The lanthanum metal oxide epitaxial buffer layer can be a compound having the general formula $La_{1-x}A_xMO_3$, where A and M are metals and $0 \leq x \leq 0.8$. A can be Sr, Ba or Ca. M can be Mn or Co.

A method for preparing an epitaxial article for applying electromagnetically active layers directly thereon includes the steps of providing a substrate with a textured metal surface and depositing a single lanthanum metal oxide epitaxial layer on the substrate. The metal surface is a preferably a biaxially-textured metal surface, formed by rolling and annealing a metal material. Metals such as Cu, Cu-based alloys, Ag, Al, Co, Mo, Cd, Pd, Pt, Ni, or Ni-based alloys are preferably rolled and annealed. If a Ni-based alloy is used, alloying agents are preferably Co, Cr, V, Mo, W, or rare earth elements.

The lanthanum metal oxide epitaxial layer can be a compound having the general formula $La_{1-x}A_xMO_3$, where A and M are metals and $0 \leq x \leq 0.8$. The lanthanum metal oxide epitaxial layer can be deposited using a sputtering process. Preferably, the sputtering is rf-magnetron sputtering.

An epitaxial article includes a substrate having a metal surface, a single electrically conductive epitaxial buffer layer, and an electromagnetically active layer disposed on and in contact with the single epitaxial buffer layer, the buffer layer being substantially crack-free. The epitaxial buffer layer can be at least 100 nm thick without substantially cracking. The epitaxial buffer layer can have a resistivity at 300 K of less than 1 mOhm-cm, or more preferably less than 0.1 mOhm-cm. In the preferred embodiment, the electromagnetically active layer includes a superconducting layer.

BRIEF DESCRIPTION OF THE DRAWINGS

There are shown in the drawings embodiments which are presently preferred, it being understood, however, that the invention is not limited to the precise arrangements and instrumentalities shown, wherein:

FIG. 2 illustrates a schematic diagram showing some example superconductor layer architectures using textured-Ni or Ni-alloy substrates.

DETAILED DESCRIPTION OF THE PREFERRED EMBODIMENTS

Figure 1:
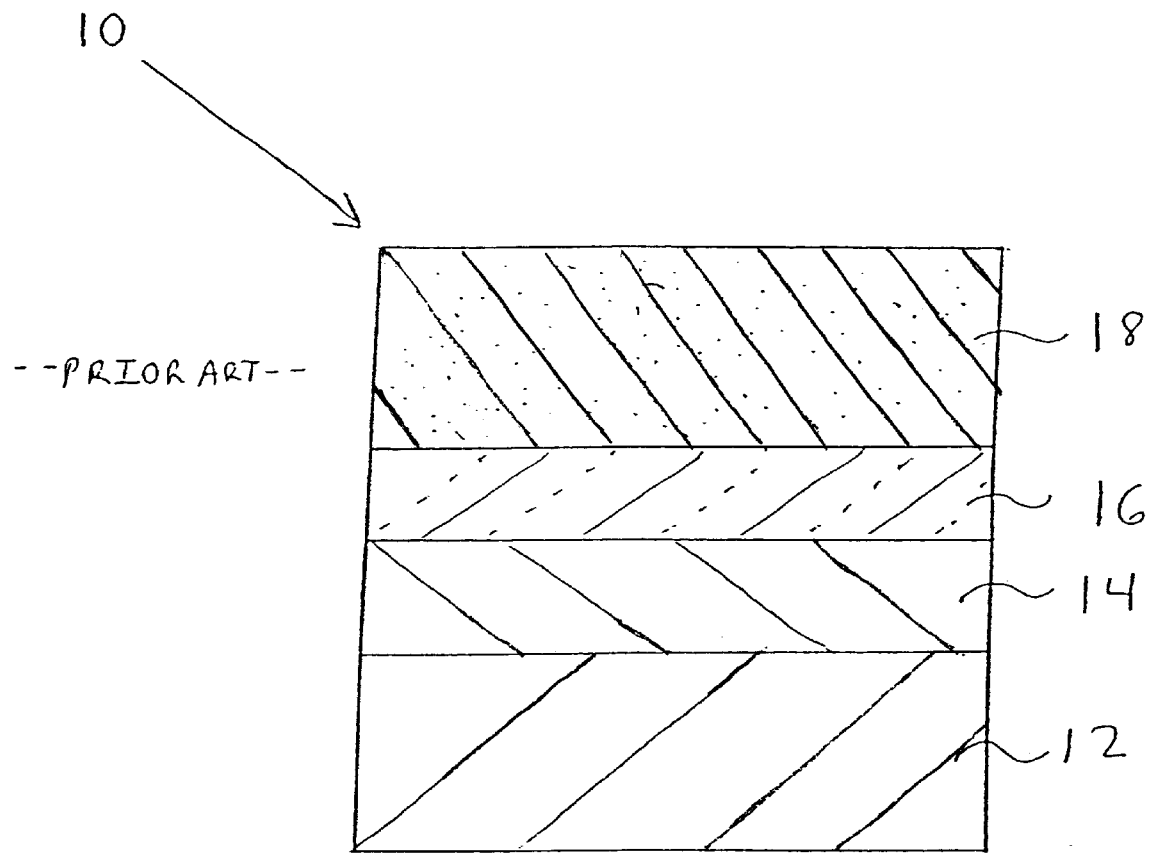
FIG. 1 is a cross-sectional view of a superconductor article having a multilayer buffer composition.

The invention relates to an epitaxial article comprising an epitaxial lanthanum metal oxide buffer layer on a substrate having a textured metal surface. The preferred lanthanum metal oxide buffer layer is lanthanum strontium manganate, $La_{1-x}Sr_xMnO_3$, where $0 \leq x \leq 0.8$ (LSMO). A preferred embodiment relates to a biaxially-textured superconductor article comprising an epitaxial lanthanum metal oxide buffer layer (001) layer grown on a biaxially-textured metal surface, and a method of fabricating this article.

A high-temperature superconducting layer can be deposited directly on the epitaxial lanthanum metal oxide buffer layer to result in the architecture $YBa_2Cu_3O_7$(YBCO)/LSMO/Ni. In such an arrangement, the article has a single buffer layer architecture that can yield a superconducting layer with a $J_c$ of at least 0.1 $MA/cm^2$ at 77 K. Preferably, the superconducting layer has a $J_c$ of at least 0.5 $MA/cm^2$ at 77 K. For YBCO coated conductors, the architecture provides improved reliability over previous superconducting architectures.

A related embodiment consists of the same lanthanum metal oxide epitaxial buffer layer on a metal substrate structure with an additional thin oxide capping layer between the lanthanum metal oxide epitaxial buffer layer and the electromagnetically active layer, such as a superconducting layer. This capping layer can be significantly thinner than a typical buffer layer in that it can be as thin as a single unit cell. Preferably, however, the capping layer is between 10 nm and 40 nm thick. The capping layer can help alleviate the lattice mismatch which can exist between the epitaxial buffer layer and the superconducting layer, and can improve the crystallinity and resulting performance of the superconducting article.

The superconductor article having a capping layer can have a $J_c$ of at least 0.2 MA/cm$^2$ at 77 K. Preferably, a superconductor article according to this embodiment can have a critical $J_c$ of at least 1.0 MA/cm$^2$ at 77 K.

Articles according to the invention can be used with any electronic application in which epitaxy and/or crystallographic texture is important, and are specifically useful in forming high-temperature superconductor articles, such as superconducting wires or tapes. Although particularly well suited for use in devices which include superconducting layers, articles formed using the invention are useful, in certain instances in conjunction with one or more additional layers, in applications including a wide variety of electromagnetic applications which require electromagnetically active layers. For example, improved piezo-electrics, photovoltaics, tribological or fuel cells can be produced using the invention. In addition, lanthanum metal oxide buffered metal substrates may be useful for GMR (Giant Magneto Resistance), ferro-electric devices, electro-optic devices and for catalytic properties.

A biaxially-textured substrate preferably used with the invention can be fabricated by scalable rolling and annealing techniques. The substrate can then be reacted by a variety of techniques to produce a chemically compatible, textured substrate. An epitaxial layer of another material can then be grown onto the textured substrate. This epitaxial layer can be a buffer layer or a conducting layer, although it is preferably a buffer layer. The texture of the substrate can be induced in the epitaxial layer. Thus, it is possible to deposit a biaxially-textured superconductor with a high JC using a mechanically-robust epitaxial lanthanum metal oxide epitaxial buffer layer directly in contact with the metal substrate surface.

A biaxially-textured article can be defined as a polycrystalline material in which the crystallographic in-plane and out-of-plane grain-to-grain misorientations are small (typically less than 20 degrees) but finite (typically greater than 2 degrees). The degree of biaxial texture can be described by specifying the distribution of grain in-plane and out-of-plane orientations as determined by x-ray diffraction. Using x-ray diffraction data, full-width-half-maximum (FWHM) data of the out-of-plane ($\Delta\omega$) and in-plane ($\Delta\phi$) reflections can be determined. Therefore, the degree of biaxial texture for a given sample can be defined by specifying the range of $\Delta\omega$ and $\Delta\phi$ for a given sample.

It is known that the $J_C$ of an oxide superconductor may be reduced significantly if misorientation angles between individual grains in the grain boundaries between grains are generally greater than approximately 5 to 10 degrees. Although some useful superconductor articles may still be formed using substrates with larger grain misorientations, it is usually desirable to obtain superconducting layers in which the number of grain boundaries with misorientation angles greater than approximately 5 to 10 degrees is minimized. Similarly, for superconductor articles in which the superconducting deposit is epitaxial with an underlying metallic or oxide buffer layer or substrate, it is desirable to minimize the number of grain boundaries with misorientations greater than approximately 5 to 10 degrees.

The metal surface can be any metal upon which a lanthanum metal oxide buffer layer may be grown. However, the metal layer is preferably at least uni-axial textured for most applications. For example, GMR devices and piezo-electrics can utilize uni-axis textured substrates. However, applied to superconducting articles, the metal surface is most preferably biaxially-textured.

As discussed above, the buffer layer may be formed from a variety of materials. The lanthanum metal oxide epitaxial buffer layer can be selected from compounds having the general formula $La_{1-x}A_xMO_3$, where A and M are metals and $0 \leq x \leq 0.8$. A can be at least one metal selected from Group IIa metals including Sr, Ba and Ca. M can be selected from the group of transitional metals, preferably selected from either Mn or Co. The buffer layer may also be formed from $LaMnO_3$ (LMO).

The lanthanum metal oxide buffer layer is substantially electrically conductive, as opposed to previous insulating buffer layers such as $CeO_2$ and YSZ. For example, LSMO layers are metallic with room temperature resistivity of around 1 mOhm-cm. Applied to superconducting articles, an electrically conductive buffer layer is highly advantageous as it can significantly enhance the field reliability of a superconductor article. Preferably the room temperature (300 K) resistivity of the lanthanum metal oxide buffer layer is less than 1 mOhm-cm. Most preferably, the room temperature resistivity is less than 0.1 mOhm-cm.

Assuming the superconductor article is used to carry high electrical currents, if superconducting properties are lost, even during a short period of time, destruction of the superconducting article from overheating can result. For example, a superconducting article loses its superconducting above the cutoff temperature, typically around 90 K. If the temperature rises above the cutoff temperature, and there is no conductive path in the superconducting article to shunt the current, the superconductor article can be damaged or destroyed, due to dissipation of excessive power through the superconductor layer. In addition, when applied to electrical power transmission lines, lightening can result in current surges which can damage or destroy the superconducting article.

Using an electrically buffer layer, such as conductive lanthanum metal oxide buffer layer to support a superconducting layer results in the formation of an electrical shunt to the metal substrate which can protect the superconductor layer. During periods the superconductor could be otherwise be damaged or destroyed due to excessive power dissipation, the lanthanum metal oxide buffer layer can direct current away from the superconducting layer to the metal substrate.

In addition, the electrically conductive lanthanum metal oxide buffer layer can permit operation of a superconducting article rather than failure, even if micro-cracks develop in the superconducting layer during field use of the superconductor. In the case of microcracks in the superconducting layer, current can bypass the micro-crack region and be substantially conducted by the parallel combination of the lanthanum metal oxide buffer layer and metal substrate, bypassing the micro-crack regions.

After formation of the buffer layer, a superconducting layer can be deposited on the exposed buffer layer by a variety of techniques that are well known in the art, such as physical vapor deposition including pulsed laser deposition, electron beam evaporation and sputtering, solution deposition and chemical vapor deposition. The superconducting layer can comprise any high-temperature superconducting materials, including $REBa_2Cu_3O_7$, where RE is a rare earth element. A biaxially-textured, high critical $J_c$ superconducting article having a (001) oriented epitaxial lanthanum metal oxide buffer layer can be formed by the additional step of growing an epitaxial superconducting layer on the (001) lanthanum metal oxide buffer surface.

For example, high temperature superconductors such as $REBa_2Cu_3O_7$, $Tl_1Ba_2Ca_{n-1}Cu_nO_{2n+3}$, $Tl_2Ba_2Ca_{n-1}Cu_nO_{2n+4}$, and $Hg_1Ba_2Ca_{n-1}Cu_nO_{2n+2}$ where n is an integer between 1 and 4 can be disposed on the lanthanum metal oxide buffer layer. Other high temperature superconductors which are chemically and epitaxially compatible can also be used with the invention.

In-plane variants superconducting layers, such as a $REBa_2Cu_3O_7$ layer, rotated by 45°, can be present, due to the lattice mismatch between the superconductor layer and the buffer layer. Minimizing or eliminating one of the in-plane variants by optimization of growth temperature and oxygen partial pressure can lead to a significant increase in the critical $J_c$. A more manufacturable approach to eliminating one of these in-plane variants is to deposit a thin, epitaxial capping layer of SRO ($SrRuO_3$ or $Sr_2RuO_4$), LNO ($LaNiO_3$), YSZ, $CeO_2$, $Y_2O_3$, or RE (rare earth) oxides, such as $RE_2O_3$ and $RE_2Zr_2O_7$. Using a lanthanum metal oxide buffer layer such as LSMO as the first buffer layer, examples of some useful architectures include YBCO/SRO/LSMO/Ni, YBCO/LNO/LSMO/Ni, YBCO/$CeO_2$/LSMO/Ni, YBCO/$CeO_2$/YSZ/LSMO/Ni, YBCO/$RE_2O_3$/LSMO/Ni, and YBCO/$RE_2Zr_2O_7$/LSMO/Ni. Depositing at least one appropriate capping layer on the lanthanum metal oxide buffer layer can improve the lattice match with the $YBa_2Cu_3O_7$ superconducting layer. Capping layers can be deposited using any suitable deposition method, including any of the deposition methods identified above.

Capping layers can be deposited at a temperature of between approximately 25° C. and approximately 900° C., and is preferably deposited at a temperature of between approximately 400° C. and approximately 850° C. The oxygen partial pressure during capping layer deposition should be between approximately $1\times10^{-11}$ Torr and approximately $2\times10^{-1}$ Torr, and is preferably between approximately $1\times10^{-5}$ Torr and approximately $1\times10^{-3}$ Torr. The capping layer can be as thin as a single unit cell, although the optimal thickness is between 10 nm and 40 nm. Incorporating this capping layer into the above-discussed single buffer layer architecture results in a relatively simple biaxially-textured superconducting article with a $J_c$ greater than 0.2 $MA/cm^2$ at 77 K, and preferably at least 1.4 $MA/cm^2$ at 77 K.

A method for forming a high-temperature superconductor with a single buffer layer architecture includes a pretreatment of the metal substrate having a surface, followed by growth of a lanthanum metal oxide buffer layer on the surface of the metal substrate. The process begins with the formation of the metal surface. If a biaxially-textured metal surface is desired, a preferred approach is to form a biaxially-textured metal substrate by rolling and annealing. During the rolling process, plastic flow causes reorientation of the lattice of the individual grains of a polycrystalline material. As a result, the polycrystalline material tends to gradually develop a texture or preferred orientation of the lattice in the grains. The orientation change proceeds as plastic flow continues, until a texture is reached that is stable against indefinite continued flow of a given type. The texture development is strongly influenced by temperature, particularly if the temperature is high enough for recrystallization to take place.

In general, plastic strains near the surface of a rolled specimen may differ from those in the interior and may produce textures that vary with depth below the surface. Therefore, specific rolling procedures can help ensure reasonably consistent textures throughout the thickness of the material. Forward rolling alone may result in homogenous texture throughout the thickness of the material. For most materials, however, reverse rolling (where the rolling direction is reversed after each pass) provides a more homogenous texture. Accordingly, reverse rolling can be used to improve the texture of the material.

Rolling speed may be an important feature in the texture development of the material, although its effect is not dominating. In general, higher rolling speeds are desirable for economical purposes. The lubrication employed during rolling can also be an important variable. Depending upon the texture desired, either no lubricant or some lubricant, such as light mineral oil, heavy mineral oil, or kerosene, can be employed to ensure homogenous texture development.

Grain size of the starting material and prior heat treatments and deformation history can also be important in determining the texture development. In general, prior to rolling, a fine grain size is desired and the initial heat treatments and deformations are designed to give a random texture in the starting material.

After the material is rolled to the desired texture, it is annealed. The development of an annealing texture involves several fundamental mechanisms. An annealing texture may develop from recovery without recrystallization (in which case it would be expected to duplicate the texture present before annealing), from primary recrystallization, or from grain growth subsequent to recrystallization. Grain size distribution can remain normal throughout the process, or a few grains may grow very large while the rest remain approximately unchanged until devoured by the large ones.

According to the invention, the metal material can be annealed in a reducing atmosphere to develop biaxial texture. This can be accomplished by annealing in a vacuum at a predetermined pressure. The pressure may be any suitable pressure, and is preferably lower than approximately $5\times10^{-6}$ Torr, and optimally less than approximately $2\times10^{-6}$ Torr. During vacuum annealing, the metal material is enclosed in an envelope formed from a material which attracts oxygen, such as tantalum. For Ni and Ni-based alloys, annealing can occur at a temperature range of between approximately 600° C. and approximately 1100° C. Preferably, however, annealing occurs between approximately 800° C. and approximately 1000° C., and ideally occurs at 1000° C. For Cu and Cu-based alloys, annealing can occur at a temperature range of between approximately 400° C. and approximately 1000° C. Preferably, however, annealing occurs between approximately 500° C. and approximately 900° C. Annealing may continue for any appropriate amount of time, and preferably occurs for approximately 60 minutes.

After rolling and annealing, a biaxially-textured metal substrate is formed upon which epitaxial layers may be grown thereon. Although the biaxially-textured metal substrate can be any metal or metal alloy upon which an epitaxial layer may be grown, the metal substrate is preferably composed of biaxially-textured Cu, Cu alloy, Co, Mo, Cd, Pd, Pt, Ag, Al, Ni, or Ni alloy. If the metal substrate is a Cu or Ni alloy, any Cu or Ni alloy upon which an epitaxial layer can be grown is acceptable. Preferably, the Ni is alloyed with Cr, Mlo, V, Co, Cu, or a rare earth element. These materials are generally preferred for most applications because they tend to reduce ferromagnetism.

The starting purity of the metal substrate is preferably at least 99.9%, and in a particularly preferred embodiment is greater than 99.99%. The degree of biaxial texture in the metal substrate, specified by the FWHM of the out-of-plane and in-plane diffraction peak, is typically greater than 2° and less than 20°, preferably less than 15°, and optimally less than 10°.

An alternative method of forming a biaxially-textured metal surface is by ion-beam assisted deposition. With this technique, a metal film is deposited by a vacuum deposition technique in the presence of an energetic ion beam. The energetic ions induce a preferred crystallographic texture in the depositing film. For (001) textured cubic materials such as Ni, an ion beam directed at an angle of approximately 45° or 54° can induce in-plane texture. These angles correspond to the (100) and (111) directions of a cube oriented with its (100) direction perpendicular to the metal surface. In this case, the metal surface is preferably composed of Cu, Cu-based alloys, Ni, Ni-based alloys, Ag, Al, Pt, Pd, Cd, Mo, or Co.

It is understood that, instead of having a biaxial texture, the metal surface can be crystalline with a single uni-axial orientation, or polycrystalline with arbitrary grain-to-grain orientation, depending on the intended application. In both cases, the crystallographic orientation of the epitaxial layer will be approximately that of the immediate metal surface.

Assuming preparation of a substrate with a textured metal surface, an epitaxial lanthanum metal oxide layer is grown on the textured metal surface. For a given buffer, substrate and desired top-layer material, there will be some optimum thickness for the buffer layer. Preferably, the minimum thickness of a buffer layer is determined by its ability to be chemically compatible with both the substrate and the top layer material, and to act as a chemical diffusion barrier to contaminants that would otherwise, "poison" the desired top-layer material. For example, nickel is a commonly used substrate material which is known to substantially degrade superconducting properties of a superconductor if allowed to reach the superconducting layer.

A buffer layer must also grow epitaxially on the substrate, and to act as a crystalline template for growth of the top layer. If the buffer layer is too thick, there may be roughening or cracking due to strain buildup, either due to lattice mismatch or differential thermal expansion, and the cost of fabrication will increase. Applied to superconducting top layers, buffer layers are preferably at least several tens of nanometers thick (e.g. 50 nm) and preferably not more than 1 micron thick (1000 nm).

Any suitable vacuum or non-vacuum deposition process may be used to grow the lanthanum metal oxide epitaxial layer. Suitable deposition processes can include vacuum methods such as pulsed laser deposition, physical vapor deposition, electron beam evaporation, and sputtering non-vacuum methods such as chemical solution deposition and chemical vapor deposition. In a preferred embodiment, however, magnetron sputtering is used to deposit the lanthanum metal oxide epitaxial layer on the metal substrate.

The sputtering process is preferably performed in a vacuum system with a base pressure of less than approximately $1 \times 10^{-5}$ Torr, and is optimally less than approximately $1 \times 10^{-6}$ Torr. The metal surface is heated in the vacuum chamber to a growth temperature which is preferably between approximately 200° C. and approximately 900° C., and is optimally in the range of approximately 500° C. to approximately 700° C. Preferably, an inert sputter gas is used, at a sputter pressure of 1–10 mTorr.

A superconducting layer, such as YBCO can be deposited on the buffer layer preferably using pulsed laser deposition (PLD). During PLD, the laser energy should be between 1 $J/cm^2$ and 10 $J/cm^2$. Preferably the laser energy is between 2.0 $J/cm^2$ and 4.0 $J/cm^2$. During deposition of YBCO, substrates are preferably heated to 750° C. to 800° C. in approximately 120 mTorr of $O_2$.

EXAMPLES

Example 1

Growth of LSMO on Textured-Ni/Ni-W (3%) Substrates by Sputtering Followed by YBCO Deposition Biaxially textured Ni (100) substrates were obtained by mechanical deformation of Ni rods to about a 95% reduction in thickness. Mechanical deformation was followed by recrystallization to the desired {100}<001> cube texture by annealing at 1100° C. for 1–2 hr in a high-vacuum furnace with a base pressure of $2 \times 10^{-6}$ Torr. Similarly, Ni-W (3%) substrates with reduced magnetism were produced. The 50 $\mu$m thick as-rolled Ni/Ni-alloy substrates were cleaned in isopropanol prior to annealing.

After annealing, the Ni substrates were mounted on a heater block using Ag paint and loaded into the vacuum chamber for on-axis sputtering. The annealed Ni-W (3 atomic %) substrates are much stronger and have reduced magnetism compared to pure Ni substrates. The yield strength (YS) at 0.2% is 150–200 MPa. This is comparable to 164 MPa YS for Ni-Cr (13 atomic %) substrates. The $La_{0.7}Sr_{0.3}MnO_3$ (LSMO) buffer layer depositions were performed with an rf-magnetron sputtering system of base pressure $1 \times 10^{-6}$ Torr, using oxide sputter targets that were 95 mm in diameter and a power of 67 Watts. Unlike the sintered and hard-pressed $CeO_2$ and YSZ targets, the LSMO target was made from a single-phase LSMO powder, which was lightly packed into a copper tray.

Deposition of LSMO layer was accomplished by sputtering at substrate temperatures ranging from 550–650° C. in the presence of Argon and/or Argon-$H_2$ (4%) mixture. Oxygen was not added intentionally. In some runs, water was added into the system to produce stoichiometric LSMO films. The deposition rate was approximately 0.71 Å/sec. The LSMO film thickness was varied in the range 200–1000 nm to investigate the effect on the microstructure and on the superconducting properties of the subsequent high temperature superconductor layer. The sputtering pressure was around 3 mTorr. Similar to rf magnetron sputtering, it may be possible to deposit LSMO buffers layers reactively using dc sputtering. In addition, it is possible to sputter buffers in the presence of low $pO_2$.

A pulsed laser deposition (PLD) technique was employed for deposition of the YBCO films on the LSMO buffers using a XeCl excimer laser system, operated with an energy density of approximately 4 $J/cm^2$. During deposition of the YBCO films, the substrates were kept at 780° C. in 120 mTorr of $O_2$. After deposition, the samples were first cooled to 600° C. at a rate of 5° C./min, then the $O_2$ pressure was increased to 550 Torr, and the samples cooled to room temperature at the same rate. Typical film thicknesses of YBCO coating were 190 nm.

The films were analyzed by X-ray diffraction A Philips model XRG3100 diffractometer with Cu $K_\alpha$ radiation was used to record powder diffraction patterns. A Picker four-circle diffractometer was used to determine the texture of the films. SEM micrographs were taken using a JOEL JSM-840 scanning electron microscope, Peabody, Mass., USA. The thickness of both buffers and YBCO films were determined by both Rutherford backscattering spectroscopy (RBS) and Alpha Step profilometer scans. The resistivity and transport critical current density, $J_c$ was measured using a standard four-probe technique. Electrical contacts of Ag were deposited onto the samples using DC sputtering followed by $O_2$ annealing in 1 atm for 30 minutes at 500° C. Values of $J_c$ were calculated using a 1-$\mu$V/cm criterion.

Figure 3:
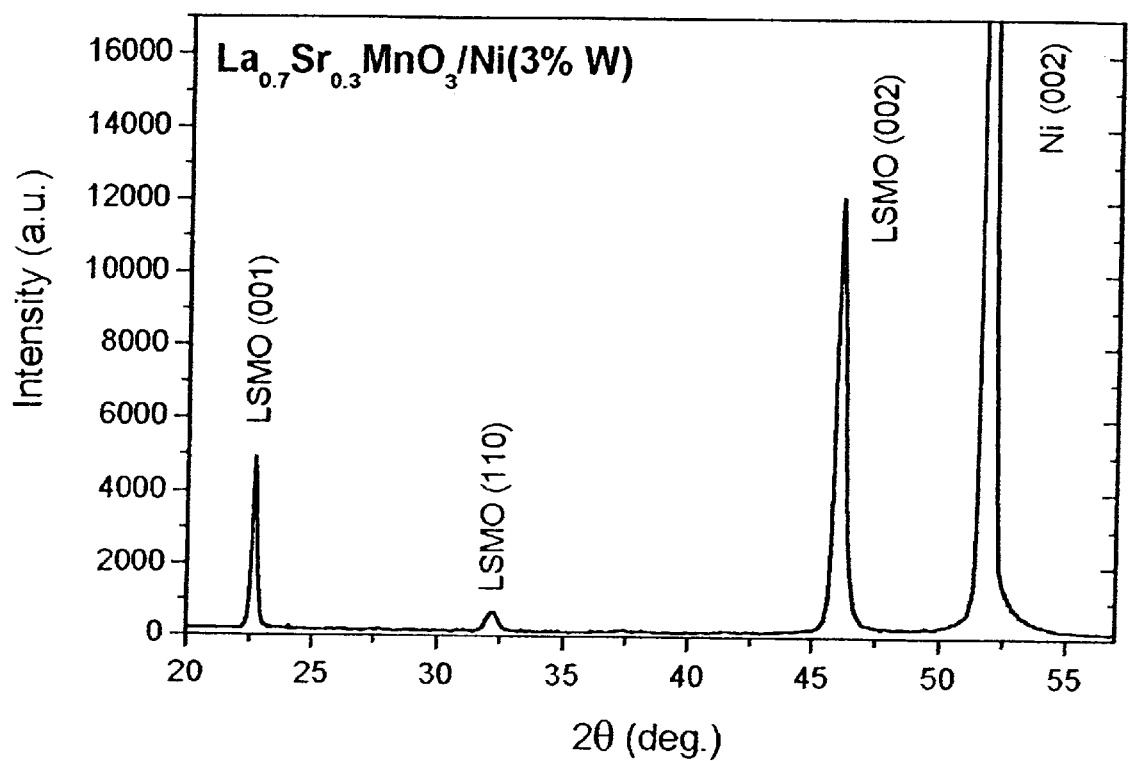
FIG. 3 illustrates a typical θ-2θ scan for a 600 nm thick LSMO ($La_{1-x}Sr_xMnO_3$ where x=0.3) film on {100}<001> Ni-W (3%) substrates.
Figure 4:
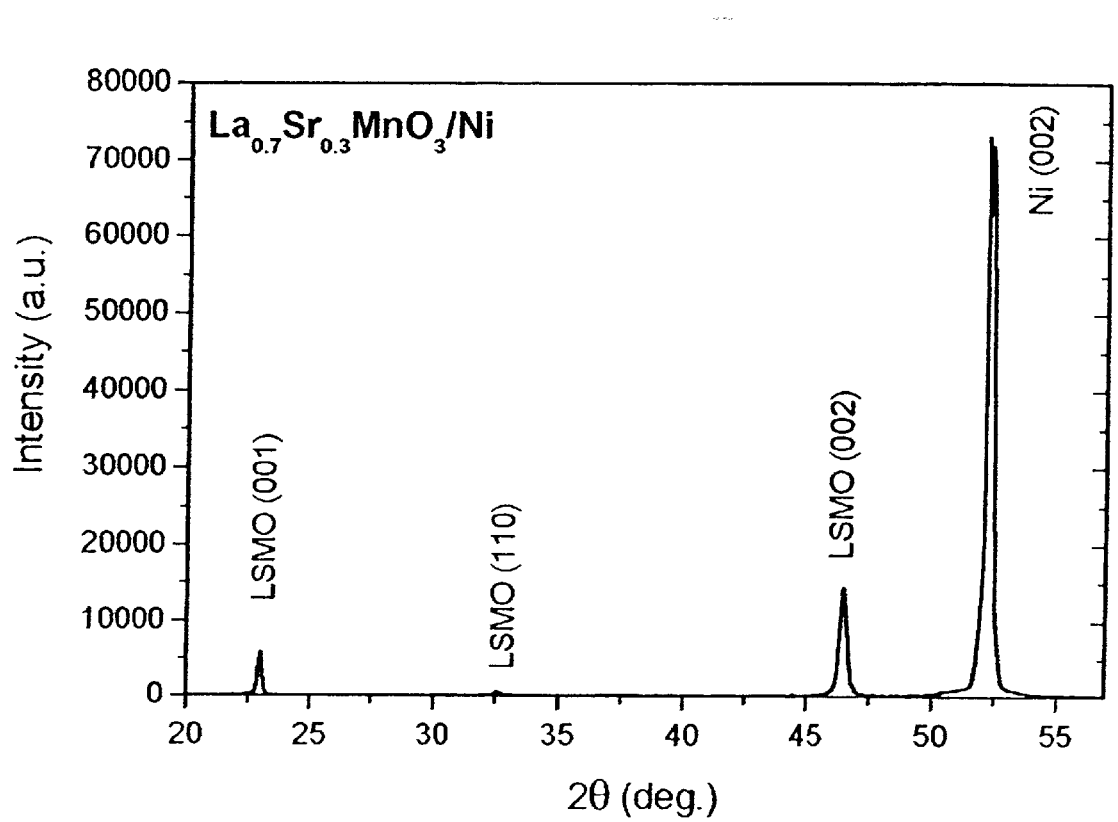
FIG. 4 illustrates a typical θ-2θ scan for a 600 nm thick LSMO film on {100}<001> Ni substrates.
Figure 5:
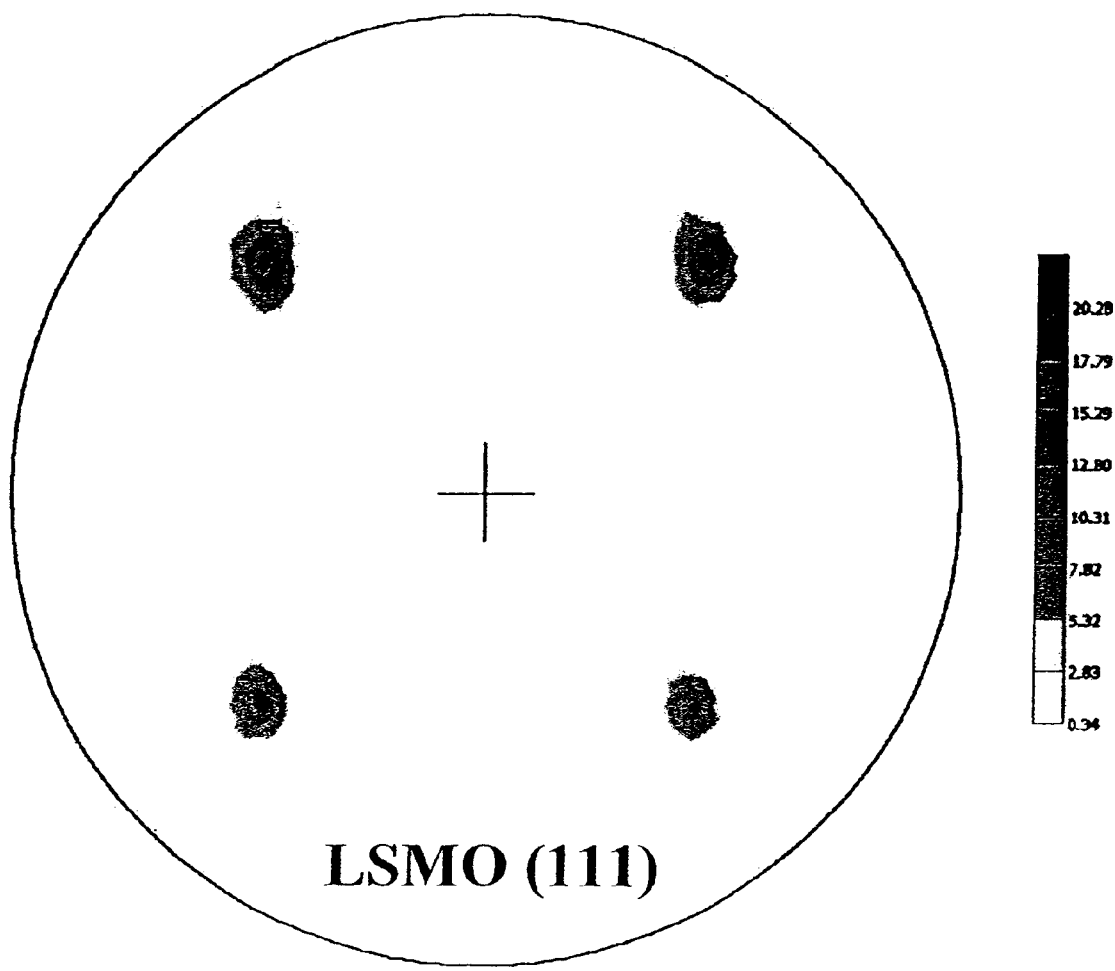
FIG. 5 illustrates a LSMO (111) pole figure for LSMO films grown directly on textured-Ni substrates by rf magnetron sputtering.

FIGS. 3 and 4 illustrate the presence of a c-axis aligned LSMO film on textured-Ni-W (3%) and textured-Ni substrates, respectively. FIG. 5 shows the presence of a single cube textured LSMO film on a textured-Ni substrate. The presence of four-fold symmetry indicates the presence of a single cube textured LSMO film.

Figure 6:
FIG. 6 illustrates the SEM surface morphology of 600 nm thick LSMO film on textured-Ni substrates.
Figure 7:
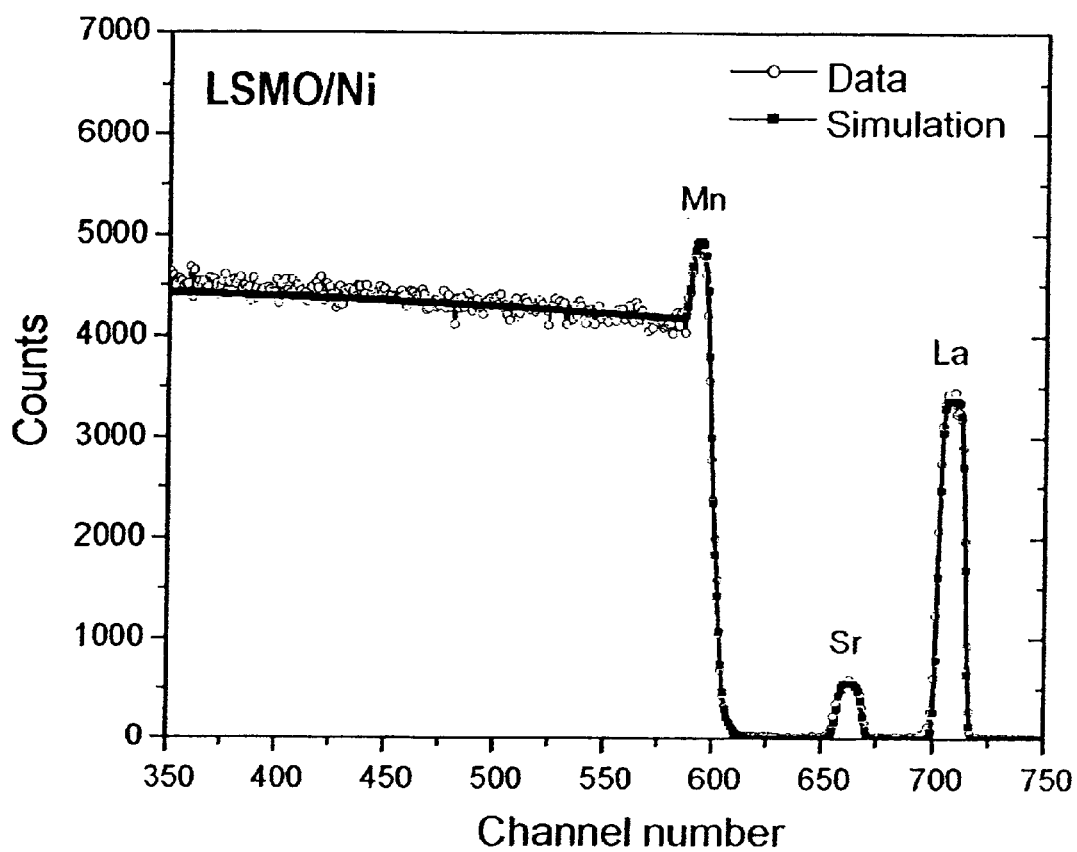
FIG. 7 illustrates Rutherford backscattering spectra from a 600 nm thick LSMO film on textured-Ni substrate.

FIG. 6 shows that crack-free LSMO buffers were produced. FIG. 7 shows RBS spectra measured with 5.0 MeV $He^{2+}$ ions at near-normal incidence, detected at a 1600 scattering angle. From the RBS spectra in FIG. 7, the simulated LSMO film thickness was determined to be 600 nm.

Figure 8:
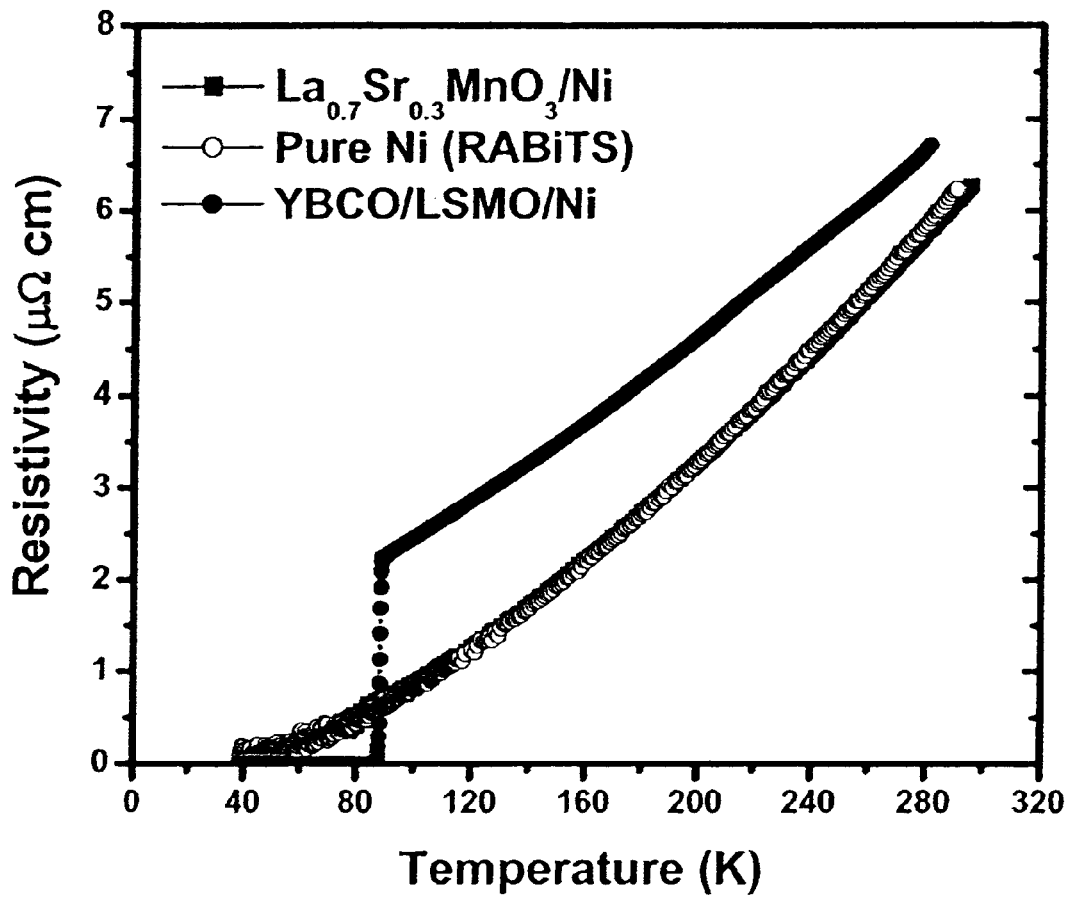
FIG. 8 illustrates the temperature dependence of resistivity for pure Ni, LSMO film on Ni, and YBCO/LSMO/Ni substrates.

FIG. 8 shows the metallic electrical behavior of the LSMO buffer layer over a range of temperatures. The resistivity behavior of both Ni and LSMO buffer layer were substantially the same. The YBCO films on LSMO/Ni substrates had comparable low resistivities at room temperature. The typical room temperature YBCO resistivity is around 250–300 $\mu$Ohm-cm. The observation of very low resistivity of 7 $\mu$Ohm-cm for YBCO films on LSMO buffered Ni substrates demonstrates that the YBCO is in good electrical contact with the bottom Ni substrates through the electrically conductive LSMO buffer layer. The $T_c^{zero}$ is at approximately 88.5 K.

Figure 9:
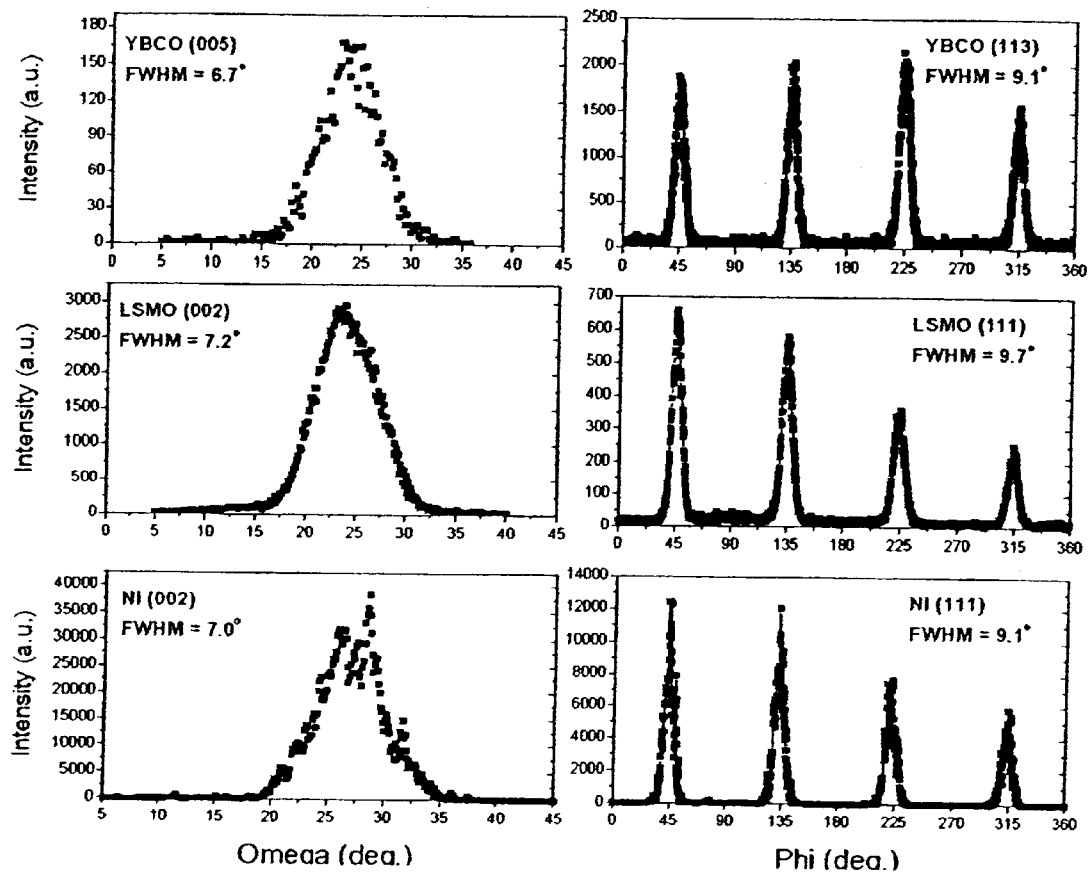
FIG. 9 illustrates Omega (ω) and Phi (φ) scans for a 190 nm thick pulsed laser deposition (PLD) YBCO film on 600 nm thick sputtered LSMO/Ni substrates.

The $\omega$ and $\phi$ scans for a 190 nm thick PLD YBCO film on 600 nm thick sputtered LSMO/Ni substrates is shown in FIG. 9. The FWHM values for each scan are shown inside the scans in FIG. 9. The FWHM values for both LSMO buffer and YBCO layers were almost the same as that of the Ni substrates.

Figure 10:
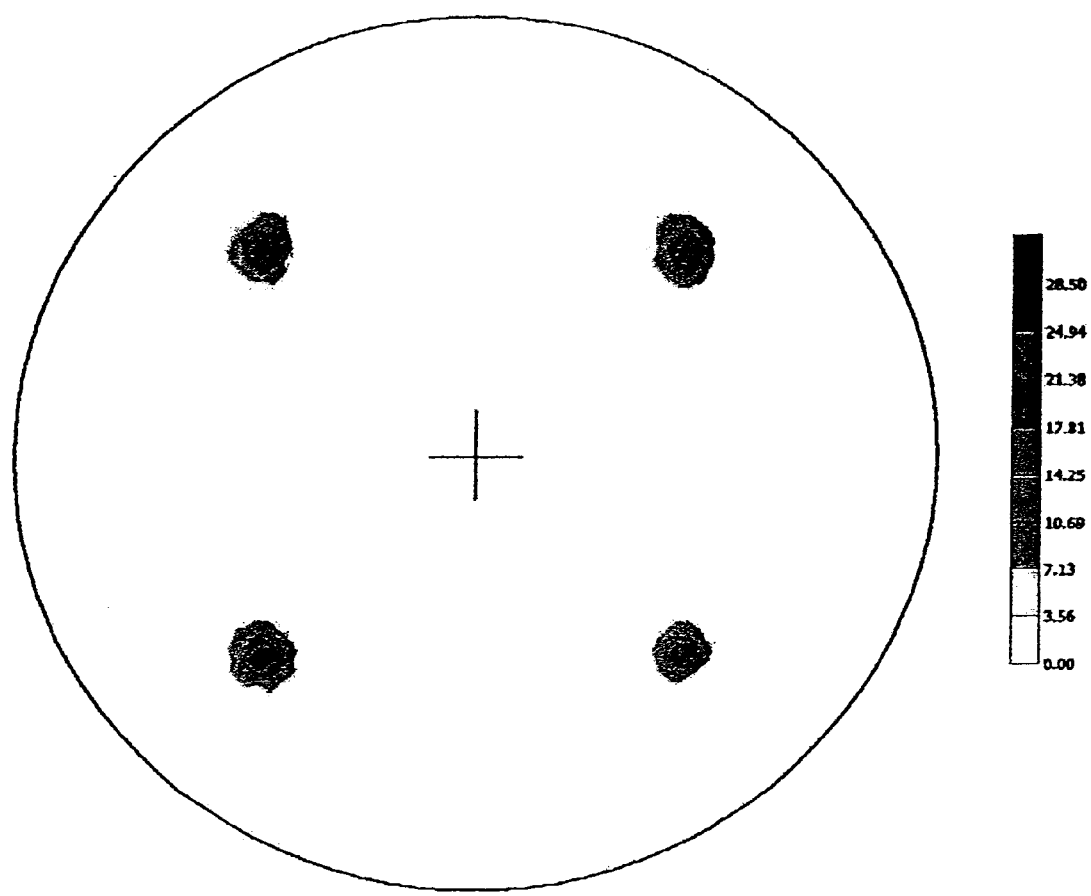
FIG. 10 illustrates a YBCO (113) pole figure for a 190 nm thick PLD YBCO film on 600 nm thick sputtered LSMO/Ni substrate.
Figure 11:
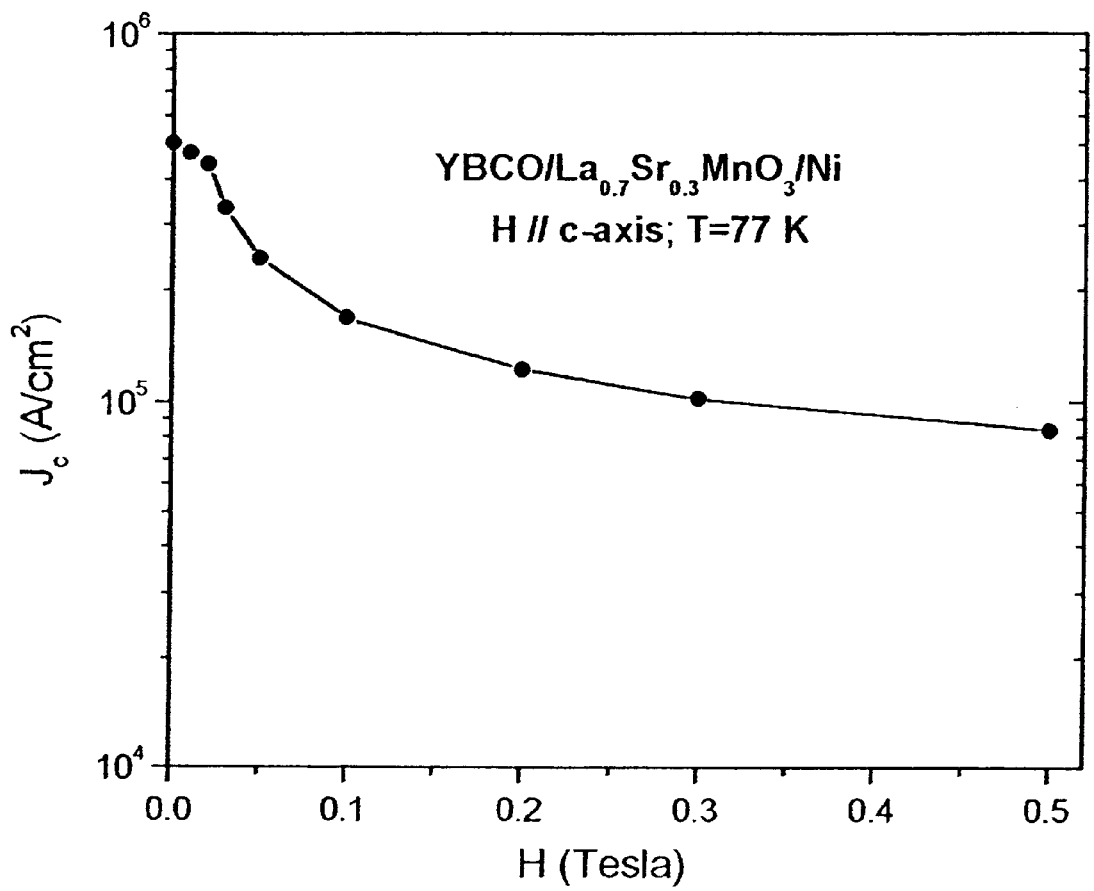
FIG. 11 illustrates the field dependence of critical current density, $J_c$, for a 190 nm thick PLD YBCO film on 600 nm thick sputtered LSMO/Ni substrates.

The YBCO (113) pole figure shown in FIG. 10 indicates the presence of a single cube textured YBCO film. The field dependence of critical current density, $J_c$ for a 190 nm thick PLD YBCO film on 600 nm thick sputtered LSMO/Ni substrates are shown in FIG. 11. Under self-field, the $J_c$ obtained at 77 K is 530,000 A/cm². There is a drop of over 80% in $J_c$ in the presence of an H field of 0.5 Tesla.

Example 2
Growth of LMO (LaMnO$_3$) on Textured-Ni/Ni-W (3 at. %) Substrates by Sputtering Followed by YBCO Deposition Biaxially textured Ni (100) substrates were obtained by mechanical deformation of Ni rods to about a 95% reduction in thickness. Mechanical deformation was followed by recrystallization to the desired {100}<001> cube texture by annealing at 1100° C. for 1–2 hr in a high-vacuum furnace with a base pressure of $2 \times 10^{-6}$ Torr. Similarly, Ni-W (3 at. %) substrates with reduced magnetism were annealed at 1300° C. for 1 hr in a flowing 1 atm Argon-H$_2$ (4%) gas mixtures. The 50 m thick as-rolled Ni/Ni-alloy substrates were cleaned in isopropanol prior to annealing.

After annealing, the Ni substrates were mounted on a heater block using Ag paint and loaded into the vacuum chamber for on-axis sputtering. The annealed Ni-W (3 atomic %) substrates are much stronger and have reduced magnetism compared to pure Ni substrates. The LaMnO$_3$ (LMO) buffer layer depositions were performed with an rf-magnetron sputtering system of base pressure $1 \times 10^{-6}$ Torr, using oxide sputter targets that were 95 mm in diameter at a power of 67 Watts. The LMO target was made from a single-phase LMO powder, which was lightly packed in a copper tray.

Deposition of LMO layer was accomplished by sputtering at substrate temperature ranging from 500–650° C. in the presence of Argon and/or Argon-H$_2$ (4%) mixture. The deposition rate was approximately 0.6 Å/sec. The sputtering pressure was around 3 mTorr. Similar to rf magnetron sputtering, it may be possible to deposit LMO buffer layers reactively using dc sputtering. In addition, it is possible to sputter buffers in the presence of low pO$_2$.

A pulsed laser deposition (PLD) technique was employed for deposition of the YBCO films on the LMO buffers using a XeCl excimer laser system, at 790° C. in 120 mTorr of O$_2$. Typical film thicknesses of the YBCO coatings were 200 nm. The films were analyzed by detailed X-ray diffraction and transport property measurements.

Figure 12:
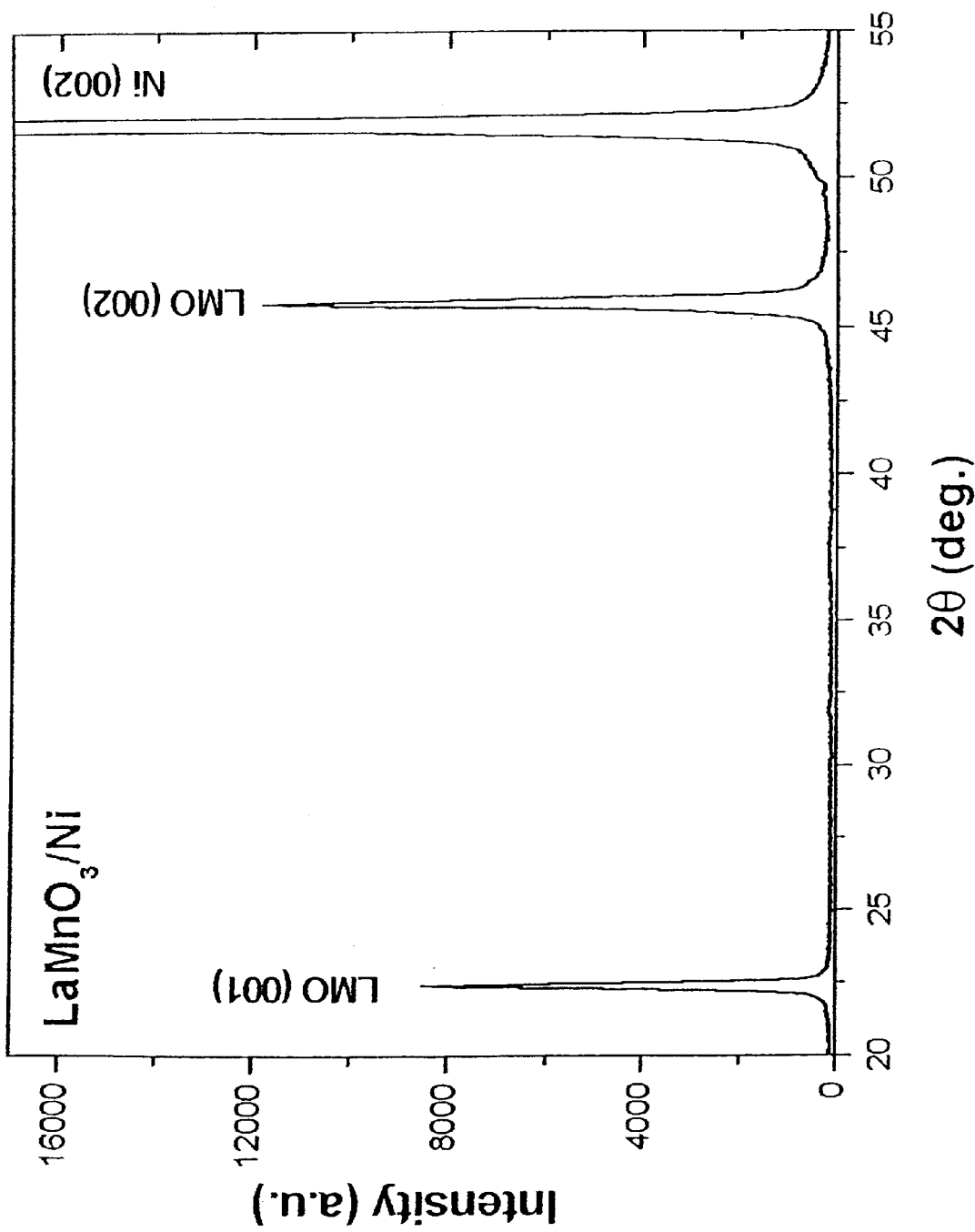
FIG. 12 illustrates a typical θ-2θ scan for a 300 nm thick LMO ($LaMnO_3$) film on {100}<001> Ni substrates.
Figure 13:
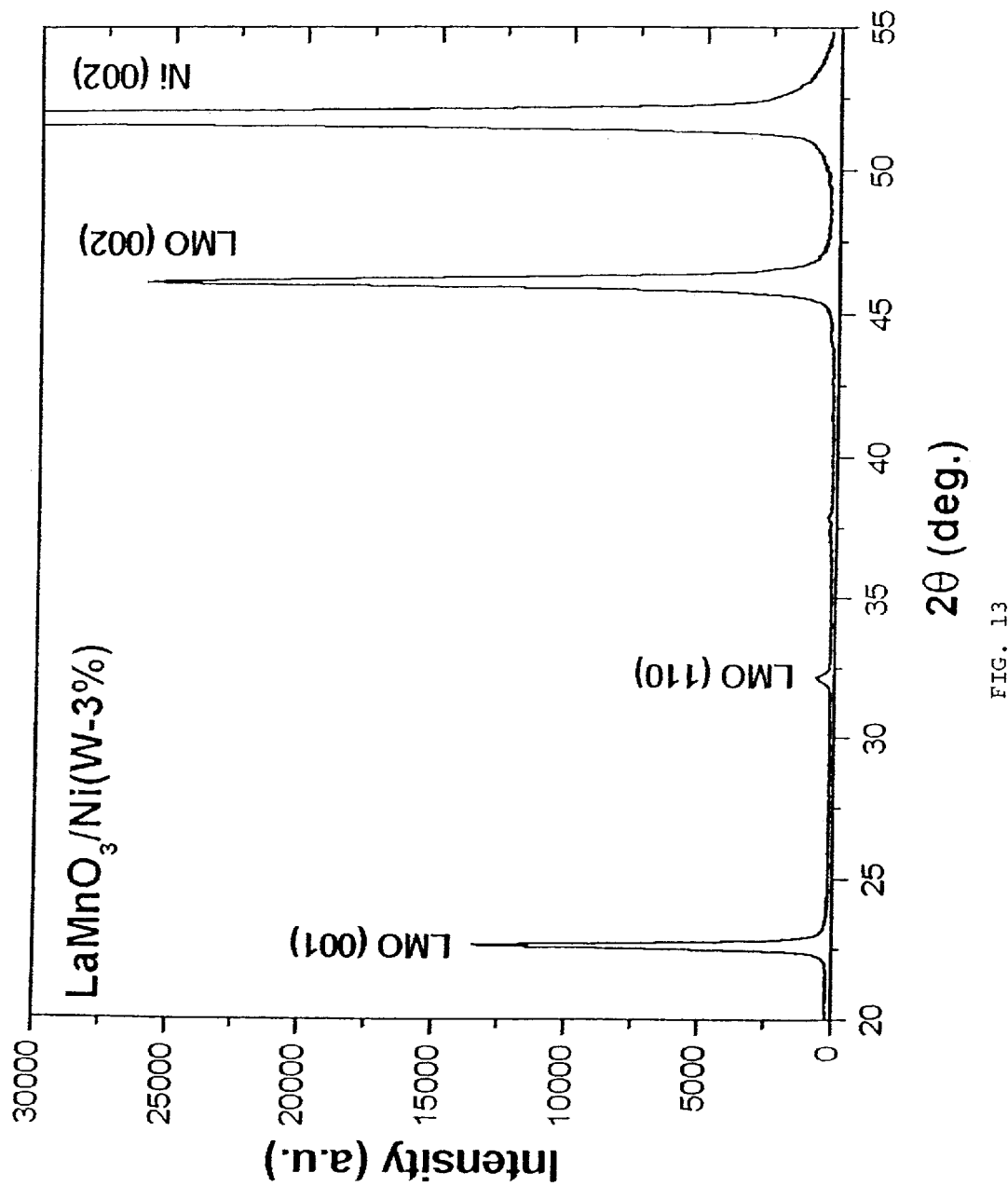
FIG. 13 illustrates a typical θ-2θ scan for a 300 nm thick LMO film on {100}<001> Ni-W (3%) substrates.
Figure 14:
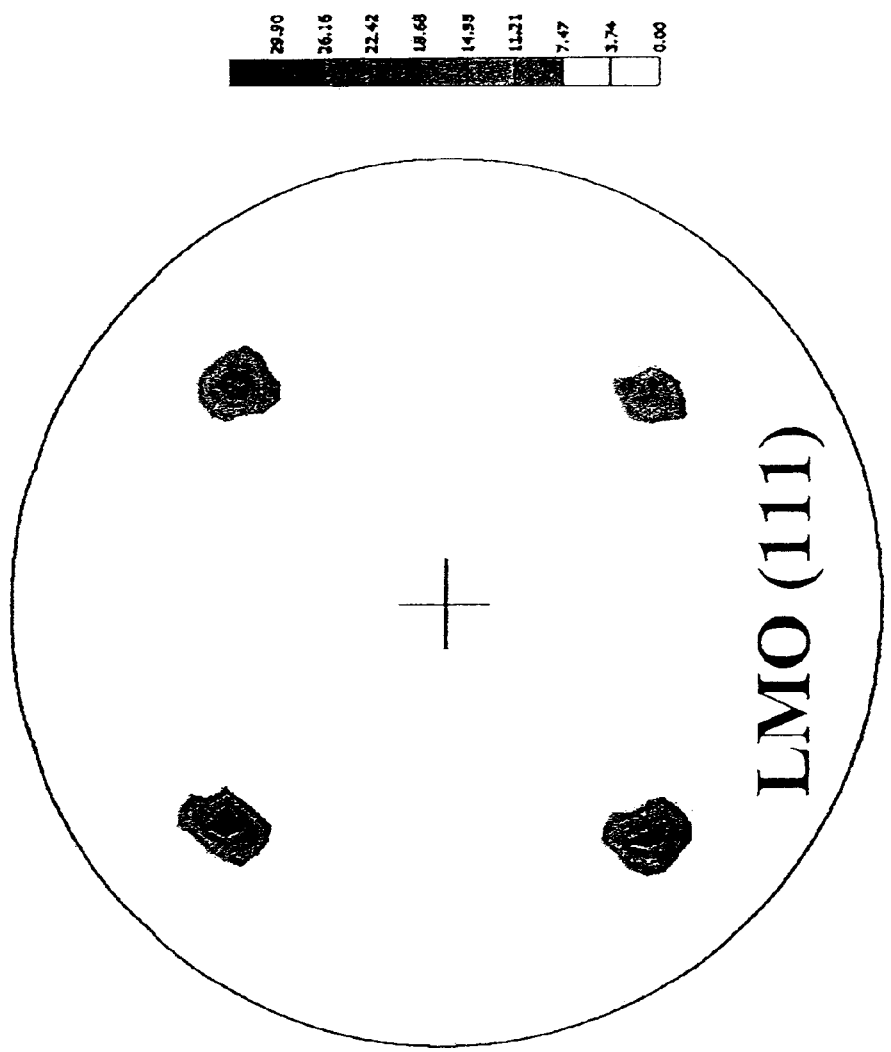
FIG. 14 illustrates a LMO (111) pole figure for a 300 nm thick sputtered LMO/Ni substrate.

FIGS. 12 illustrates a typical θ-2θ scan for a 300 nm thick LMO film on {100}<001> Ni substrates while FIG. 13 illustrates a typical θ-2θ scan for a 300 nm thick LMO film on {100}<001> Ni-W (3%) substrates. These demonstrate the presence of a c-axis aligned LMO film on textured-Ni and Ni-W (3%) substrates, respectively. FIG. 14 is a LMO (111) pole figure for a 300 nm thick sputtered LMO/Ni substrate which shows the presence of a single cube textured LMO film on a textured-Ni substrate. The presence of four-fold symmetry indicates the presence of a single cube textured LMO film.

Figure 15:
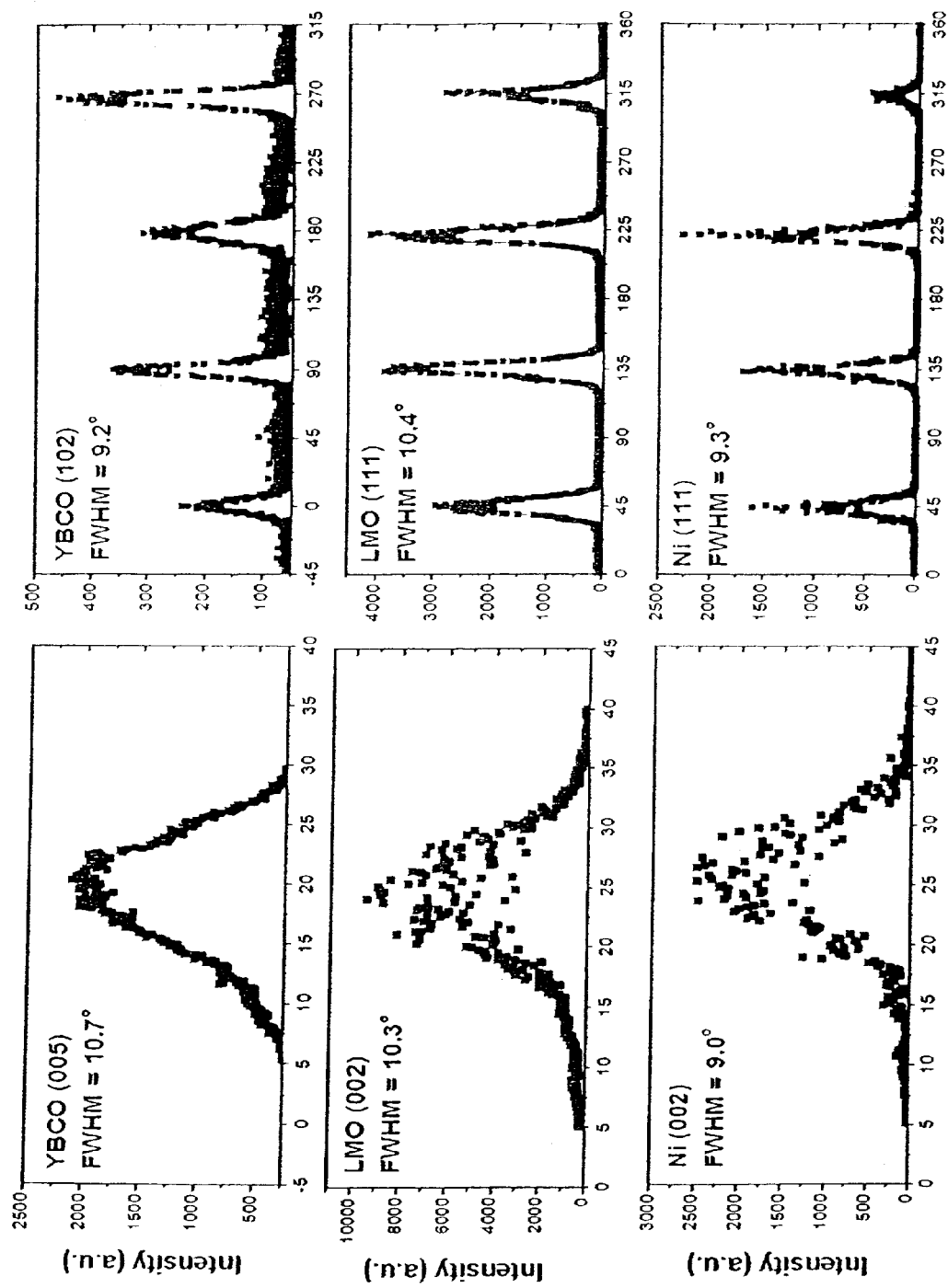
FIG. 15 illustrates Omega (ω) and Phi (φ) scans for a 200 nm thick pulsed laser deposition (PLD) YBCO film on a 300 nm thick sputtered LMO/Ni substrate.

FIG. 15 illustrates Omega ($\omega$) and Phi ($\phi$) scans for a 200 nm thick PLD YBCO film on a 300 nm thick sputtered LMO/Ni substrate. The FWHM values for each scan are shown inside the scans in FIG. 15. The FWHM values for both LMO buffer and YBCO layers were almost the same as that of the Ni substrates.

Figure 16:
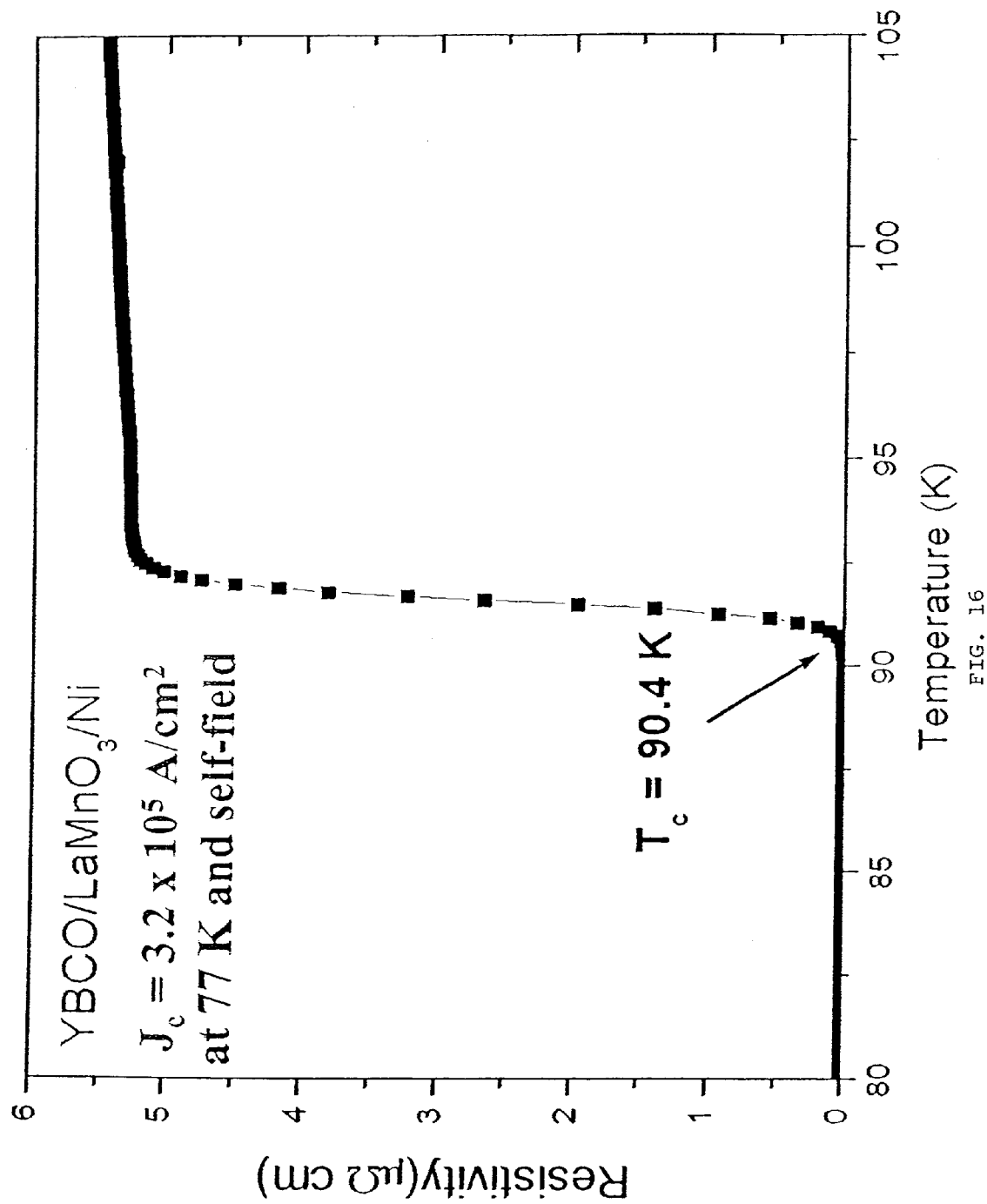
FIG. 16 illustrates the temperature dependence of resistivity for a 200 nm thick PLD YBCO film on a 300 nm thick sputtered LMO/Ni substrate.

FIG. 16 illustrates the temperature dependence of resistivity for a 200 nm thick PLD YBCO film on 300 nm thick sputtered LMO/Ni substrates. The transition temperature $T_c$ (zero resistance) is at 90.4 K. The observation of a higher $T_c$ indicates that there is essentially no contamination from the underlying LMO layer. Under self-field, the critical current density, $J_c$ obtained at 77 K is 320,000 A/cm².

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

We claim:

1. An epitaxial article, comprising:
   a substrate having a textured non-noble metal surface;
   a single lanthanum metal oxide epitaxial buffer layer disposed on and in contact with said surface of said substrate, and
   a superconducting layer disposed on and in contact with said single epitaxial buffer layer, said superconducting layer providing a Jc of at least 0.5 MA/cm² at 77 K.

2. The article according to claim 1, wherein said lanthanum metal oxide epitaxial buffer layer is selected from compounds having the general formula $La_{1-x}A_xMO_3$, wherein A and M are metals and $0 \leq x \leq 0.8$.

3. The article according to claim 2, wherein A is at least one selected from the group consisting of Sr, Ba and Ca.

4. The article according to claim 2, wherein M is at least one selected from the group consisting of Mn and Co.

5. The article according to claim 1, wherein said single lanthanum metal oxide epitaxial buffer layer is electrically conductive and said superconducting layer is continuously electrically connected to said textured non-noble metal surface.

6. The article according to claim 1, wherein said lanthanum metal oxide epitaxial buffer layer has a resistivity at 300 K of less than 0.1 mOhm-cm.

7. The article according to claim 1, wherein said lanthanum metal oxide epitaxial buffer layer is $La_{0.7}Sr_{0.3}MnO_3$.

8. The article according to claim 1, wherein said lanthanum metal oxide epitaxial buffer layer is $LaMnO_3$.

9. The article according to claim 1, wherein said superconducting layer is selected from the consisting of $REBa_2Cu_3O_7$ where RE is a rare earth element, $Tl_1Ba_2Ca_{n-1}Cu_nO_{2n+3}$, where n is an integer between 1 and 4, $Tl_2Ba_2Ca_{n-1}Cu_nO_{2n+4}$ where n is an integer between 1 and 4, and $Hg_1Ba_2Ca_{n-1}Cu_nO_{2n+2}$, where n is an integer between 1 and 4.

10. The article according to claim 1, wherein said substrate is a rolled and annealed biaxially-textured metal substrate.

11. The article according to claim 1, wherein said textured metal surface comprises at least one metal selected from the group consisting of Cu, Cu-based alloys, Co, Mo, Cd, Pd, Pt, Ag, Al, Ni, and Ni-based alloys.

12. The article according to claim 1, wherein said textured metal surface comprises at least one metal selected from the group consisting of Ni and Ni-based alloys with at least one alloying agent selected from the group consisting of Co, Cr, V, Mo, W, and rare earth elements.

13. An epitaxial article for providing a foundation for applying electromagnetically active layers directly thereon, comprising:
a substrate having a textured non-noble metal surface, and
a single lanthanum metal oxide epitaxial buffer layer disposed on and in contact with said surface of said substrate, whereby another buffer layer is not required.

14. The article according to claim 13, wherein said lanthanum metal oxide epitaxial buffer layer is selected from compounds having the general formula where $La_{1-x}A_xMO_3$, wherein A and M are metals and $0 \leq x \leq 0.8$.

15. The article according to claim 14, wherein A is at least one selected from the group consisting of Sr, Ba and Ca.

16. The article according to claim 14, wherein M is at least one selected from the group consisting of Mn and Co.

17. The article according to claim 13, wherein said single lanthanum metal oxide epitaxial buffer layer is electrically conductive and is continuously electrically connected to said textured non-noble metal surface.

18. The article according to claim 13, wherein said lanthanum metal oxide epitaxial buffer layer has a resistivity at 300 K of less than 0.1 mOhm-cm.

19. The article according to claim 13, wherein said lanthanum metal oxide epitaxial buffer layer is $La_{0.7}Sr_{0.3}MnO_3$.

20. The article according to claim 13, wherein said lanthanum metal oxide epitaxial buffer layer is $LaMnO_3$.

* * * * *